(12) United States Patent
Ikeda et al.

(10) Patent No.: US 6,988,783 B2
(45) Date of Patent: Jan. 24, 2006

(54) LIQUID DETECTION METHOD, LIQUID DETECTION APPARATUS AND PRINTING APPARATUS USING THE LIQUID DETECTION

(75) Inventors: Tetsuhito Ikeda, Tokyo (JP); Shinji Takagi, Kanagawa (JP); Toshiharu Inui, Kanagawa (JP); Kentaro Yano, Kanagawa (JP); Masao Kato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 118 days.

(21) Appl. No.: 10/614,012

(22) Filed: Jul. 8, 2003

(65) Prior Publication Data

US 2004/0017443 A1   Jan. 29, 2004

(30) Foreign Application Priority Data

Jul. 8, 2002   (JP) .............................. 2002-199211

(51) Int. Cl.
    *B41J 2/01*   (2006.01)
(52) U.S. Cl. .............................. 347/19; 347/7; 347/81
(58) Field of Classification Search ................... 347/7, 347/19, 81; 250/222.2, 575; 73/861.31; 356/335
See application file for complete search history.

(56) References Cited

U.S. PATENT DOCUMENTS

| | | | |
|---|---|---|---|
| 4,313,124 A | 1/1982 | Hara | 347/57 |
| 4,345,262 A | 8/1982 | Shirato et al. | 347/10 |
| 4,459,600 A | 7/1984 | Sato et al. | 347/47 |
| 4,463,359 A | 7/1984 | Ayata et al. | 347/56 |
| 4,558,333 A | 12/1985 | Sugitani et al. | 347/65 |
| 4,608,577 A | 8/1986 | Hori | 347/66 |
| 4,620,195 A * | 10/1986 | Eblen et al. | 347/49 |
| 4,723,129 A | 2/1988 | Endo et al. | 347/56 |
| 4,740,796 A | 4/1988 | Endo et al. | 347/56 |
| 6,155,673 A | 12/2000 | Nakajima et al. | 347/61 |
| 6,474,763 B1 | 11/2002 | Murakami et al. | 347/14 |
| 6,540,318 B1 * | 4/2003 | Ikeda | 347/19 |
| 6,719,400 B2 * | 4/2004 | Inui et al. | 347/23 |

FOREIGN PATENT DOCUMENTS

| | | |
|---|---|---|
| JP | 54-56847 | 5/1979 |
| JP | 54-161938 | 12/1979 |
| JP | 59-6231 | 2/1984 |
| JP | 59-123670 | 7/1984 |
| JP | 59-138461 | 8/1984 |
| JP | 60-71260 | 4/1985 |
| JP | 8-323993 | 12/1996 |
| JP | 8-336986 | 12/1996 |

(Continued)

*Primary Examiner*—Hai Pham
*Assistant Examiner*—Lam Nguyen
(74) *Attorney, Agent, or Firm*—Fitzpatrick, Cella, Harper & Scinto

(57) ABSTRACT

An inkjet printing apparatus is adapted to use a non-contact method for detecting the presence and the amount of liquid, in the form of ink droplets discharged from a printhead or ink tank, using electromagnetic waves in the form of infrared rays. The apparatus and method employ an infrared sensor to detect infrared radiation emitted by the ink in proportion to the amount of ink present. The apparatus and method further employ one of various shielding members to prevent the intrusion of infrared radiation noise into the infrared sensor field of detection, and, in some aspects, a fan to control air flow within the field of detection. The result is less noise in the detection signals of the infrared sensor, and therefore a more sensitive and more reliable liquid detection method and liquid detection apparatus.

8 Claims, 5 Drawing Sheets

FOREIGN PATENT DOCUMENTS

| | | |
|---|---|---|
| JP | 9-201967 | 8/1997 |
| JP | 10-119307 | 5/1998 |
| JP | 2000-289220 | * 10/2000 |
| JP | 2000-351219 | 12/2000 |
| JP | 2001-113677 | 4/2001 |
| JP | 2002-001961 | 1/2002 |

* cited by examiner

LIQUID DETECTION METHOD, LIQUID DETECTION APPARATUS AND PRINTING APPARATUS USING THE LIQUID DETECTION

CLAIM OF PRIORITY

The present application claims priority under 35 U.S.C. §119 from Japanese Patent Application No. 2002-199211, entitled "Liquid Detection Method, Liquid Detection Apparatus and Printing Apparatus Using the Liquid Detection Apparatus" and filed on Jul. 8, 2002, the entire contents of which are hereby incorporated by reference herein.

FIELD OF THE INVENTION

This invention relates to a liquid detection method, liquid detection apparatus and printing apparatus using the liquid detection apparatus, and more particularly, to a liquid detection method, liquid detection apparatus and printing apparatus using the liquid detection apparatus for detecting infrared rays radiated from liquid and conducting a non-contact analysis of the liquid.

BACKGROUND OF THE INVENTION

As office automation has advanced and office equipment become more sophisticated, the use of color images has grown accordingly.

In order to meet the growing demand for color imaging, printing apparatuses have been developed that rely on any of several different imaging techniques, such as, for example, inkjet printing methods and electrophotographic methods. Color inkjet printing apparatuses in particular have improved rapidly, using ever-smaller discharged droplets and ever-higher resolutions to provide inexpensive yet high-quality color printing.

However, smaller discharged droplets make it harder to maintain reliable discharge. What happens is that, over time, ink retained in the printhead ink discharge nozzles (hereinafter "nozzles") increases its viscosity just as, in general, the diameter of the nozzles is being reduced in order to make the discharged droplets smaller, thereby increasing a tendency toward clogged nozzles.

In order to overcome this problem, inkjet printing apparatuses forcefully suck the ink out of the nozzles as convenient or as necessary, to remove clogs or to prevent them from discharge failure. However, since this suction itself wastes a lot of ink, it is necessary to minimize unnecessary ink waste in the suction operation.

Accordingly, in order to reduce the number of such suction recovery operations, several types of detection systems for detecting the presence of ink droplets to be discharged have been developed. Broadly speaking, these systems can be divided into three main types: those that rely on optical detection, those that involve thermal detection and those that use vibration detection. A brief description of each of these techniques follows.

(1) Optical Detection

This technique involves passing the discharged ink droplets through an optical path formed from the light-emitting element to the photosensor, so that the apparatus determines that an ink droplet is being discharged whenever an interruption in the light (that is, the optical path) is detected. A more complete description is disclosed in Japanese Patent Publication For Opposition (KOKOKU) No. 59-6231. A method for using a laser as the light source is disclosed in Japanese Patent Publication Laid-Open (KOKAI) No. 10-119307.

(2) Thermal Detection

This technique includes methods for spraying ink onto a thermo-sensor and detecting an ink discharge from a rise in the temperature of the ink (taught by Japanese Patent Publication Laid-Open No. 54-161938), methods for detecting temperature changes from the vaporization heat at the time the ink is vaporized (taught by Japanese Patent Publication Laid-Open No. 8-323993), and methods for detecting a difference in the trend of a rise in temperature of the printhead during discharge drive when there is ink present and when there is no ink present (taught by Japanese Patent Publication Laid-Open No. 4-6549).

(3) Vibration Detection

This technique includes a method involving striking the ink against an external vibration detection plate and detecting an ink discharge from the vibrations generated from the ink droplets striking the plate (taught by Japanese Patent Publication Laid-Open No. 8-336986) as well as a method for detecting the vibration (shock wave) propagated through the printhead when the ink bubble bursts (taught by Japanese Patent Publication Laid-Open No. 9-201967).

However, the above-described conventional discharged ink droplet detection methods have the following disadvantages:

(1) Optical Detection

With this technique, as the discharged ink droplets are made smaller in order to increase printing density, the proportion of the light occupied by the discharged ink droplets declines compared to the total amount of light reaching the photosensor, resulting in an overall decline in detection sensitivity. As a result, it is increasingly difficult to obtain adequate detection performance in apparatuses employing the smaller discharged ink droplets.

(2) Thermal Detection

With this technique, generally ink containing a non-volatile solution is sprayed directly onto the detection means, so some means is required for removing the ink from the detection means. This requirement complicates the construction of the apparatus.

(3) Vibration Detection

For vibration detection methods involving striking the discharged ink droplets against an external vibration detection plate, there are two main disadvantages. Like the thermal detection technique, this method also requires some means to clean away the ink and so its configuration is somewhat complicated. Moreover, this technique, which involves detecting tiny vibrations propagated inside the printhead when the ink bubbles burst, must be able to suppress all vibration due to sources other than the discharged ink droplets in order to obtain an adequate S/N. However, it is not usually possible to attain such high S/N in the printing apparatuses currently on the market because it is difficult to suppress such extraneous vibrations.

In short, all the conventional discharged ink droplet detection methods currently used in inkjet printing apparatuses described above have some disadvantage. Accordingly, there is an urgent need to be able to detect discharged ink droplets without actually contacting the droplets, and which have the sensitivity to be able to detect and accommodate the higher resolutions and smaller droplet diameters (and smaller overall droplet volumes) that are likely to be developed in the future.

Given the above-described drawbacks of the conventional art, Japanese Patent Application No. 11-100494 taught one such sought-after method, in which electromagnetic waves radiated from the discharged ink droplets are detected without contact during passage of the discharged ink droplets. Since this detection technique is a non-contact type, there is no need for the cleaning means required with the conventional thermal detection method and some of the vibration detection methods described above. Moreover, even a smaller droplet volume is not an impediment to good detection because sensitivity can be improved by raising the temperature of the discharged ink. Therefore it can be said that this detection method is an extremely effective technique for detecting the presence of even the small ink droplets likely to be developed in the inkjet printing apparatuses of the not-so-distant future.

However, the detection method described in Japanese Patent Application No. 11-100494 does have drawbacks of its own. For example, if, during detection, material other than the ink droplets to be detected is present within the detection field or if there is a change in the convection of the air, the amount of energy in the electromagnetic waves present in the detection area will fluctuate, becoming noise during detection and possibly giving false readings. Moreover, even if no such problem as just described actually occurs, detection sensitivity must be improved, by reducing the noise level so as to improve the S/N.

SUMMARY OF THE INVENTION

Accordingly, the present invention is conceived as a response to the above-described disadvantages of the conventional art.

For example, a liquid detection method, a liquid detection apparatus, and a printing apparatus using the liquid detection apparatus according to the present invention is capable of detecting small size and small volume droplets with high sensitivity and high reliability.

According to one aspect of the present invention, preferably a liquid detection method comprises: a detection step of detecting electromagnetic waves radiated from an area of a discharge path of liquid discharged from a liquid supply source by using a detection unit provided near the discharge path; a minimize step of minimizing electromagnetic waves radiated from a medium other than the liquid or variation in the electromagnetic waves during detection of the electromagnetic waves in the detection step; and a determination step of determining whether or not the liquid is present and, if present, determining the amount of the discharged liquid based on the electromagnetic waves detected in the detection step.

According to another aspect of the present invention, preferably a liquid detection apparatus comprises: detection means, provided near a discharge path of liquid discharged from a liquid supply source, for detecting electromagnetic waves radiated from an area of the discharge path; suppression means for minimizing electromagnetic waves radiated from a medium other than the liquid or variation in the electromagnetic waves during detection of the electromagnetic waves by the detection means; and determination means for determining whether or not the liquid is present and, if present, determining the amount of the discharged liquid based on the electromagnetic waves detected by the detection means.

In the apparatus, preferably the electromagnetic waves are infrared rays, and the detection means is an infrared sensor.

In the apparatus, it may be preferable that the suppression means is a shield provided in front of a source of infrared rays radiated from a medium other than the liquid.

Alternatively, it may be preferable in the apparatus that the suppression means is a housing that covers the infrared sensor and an infrared ray detection field of the infrared sensor.

In this case, it is more preferable that the housing is provided with an opening for passage of the discharged liquid.

Also, it is more preferable that an air intake opening is provided on the housing in the apparatus, and a fan is provided at a position opposite the air intake opening on the housing so as to generate a steady air flow inside the housing.

Note that the liquid includes ink.

In the above apparatus, the liquid supply source may be an inkjet printhead, and in this case, preferably the infrared sensor is located in front of ink discharge nozzles on the inkjet printhead, near a flight area of ink droplets discharged from the inkjet printhead.

Alternatively, in the above apparatus, the liquid supply source may be an ink tank, and in this case, preferably the infrared sensor is located near a tube connected to an outflow outlet provided in the ink tank.

According to still another aspect of the present invention, preferably a printing apparatus according to the above-described liquid detection apparatus comprises: an inkjet printhead having an electrothermal transducer which generates heat energy to be applied to ink in order to discharge the ink by using the heat energy; and adjustment means for adjusting the temperature of the ink for detection of ink droplets by the liquid detection apparatus by sending an electric current into the electrothermal transducer.

In accordance with the present invention as described above, in a case where presence/absence of liquid discharged from a liquid supply source and/or an amount of discharged liquid is evaluated by detecting electromagnetic waves, the electromagnetic waves radiated from a medium other than the target liquid or variation in the electromagnetic waves during detection of the electromagnetic waves in detection means for detecting the electromagnetic waves is minimized.

The invention is particularly advantageous since it is possible to perform liquid detection with higher sensitivity and higher reliability.

For example, as the printing resolution of an inkjet printing apparatus becomes higher, this invention makes it possible to detect a small size and small volume of ink droplet discharged from an inkjet printhead with higher sensitivity.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

In this specification, the terms "print" and "printing" not only include the formation of significant information such as characters and graphics, but also broadly includes the formation of images, figures, patterns, and the like on a printing medium, or the processing of the medium, regardless of whether they are significant or insignificant and whether they are so visualized as to be visually perceivable by humans.

Also, the term "printing medium" not only includes a paper sheet used in common printing apparatuses, but also broadly includes materials, such as cloth, a plastic film, a metal plate, glass, ceramics, wood, and leather, capable of accepting ink.

Furthermore, the term "ink" (to be also referred to as a "liquid" hereinafter) should be broadly interpreted similar to the definition of "print" described above. That is, "ink" includes a liquid which, when applied onto a printing medium, can form images, figures, patterns, and the like, can process the printing medium, and can process ink (e.g., can solidify or insolubilize a coloring agent contained in ink applied to the printing medium).

Figure 1:
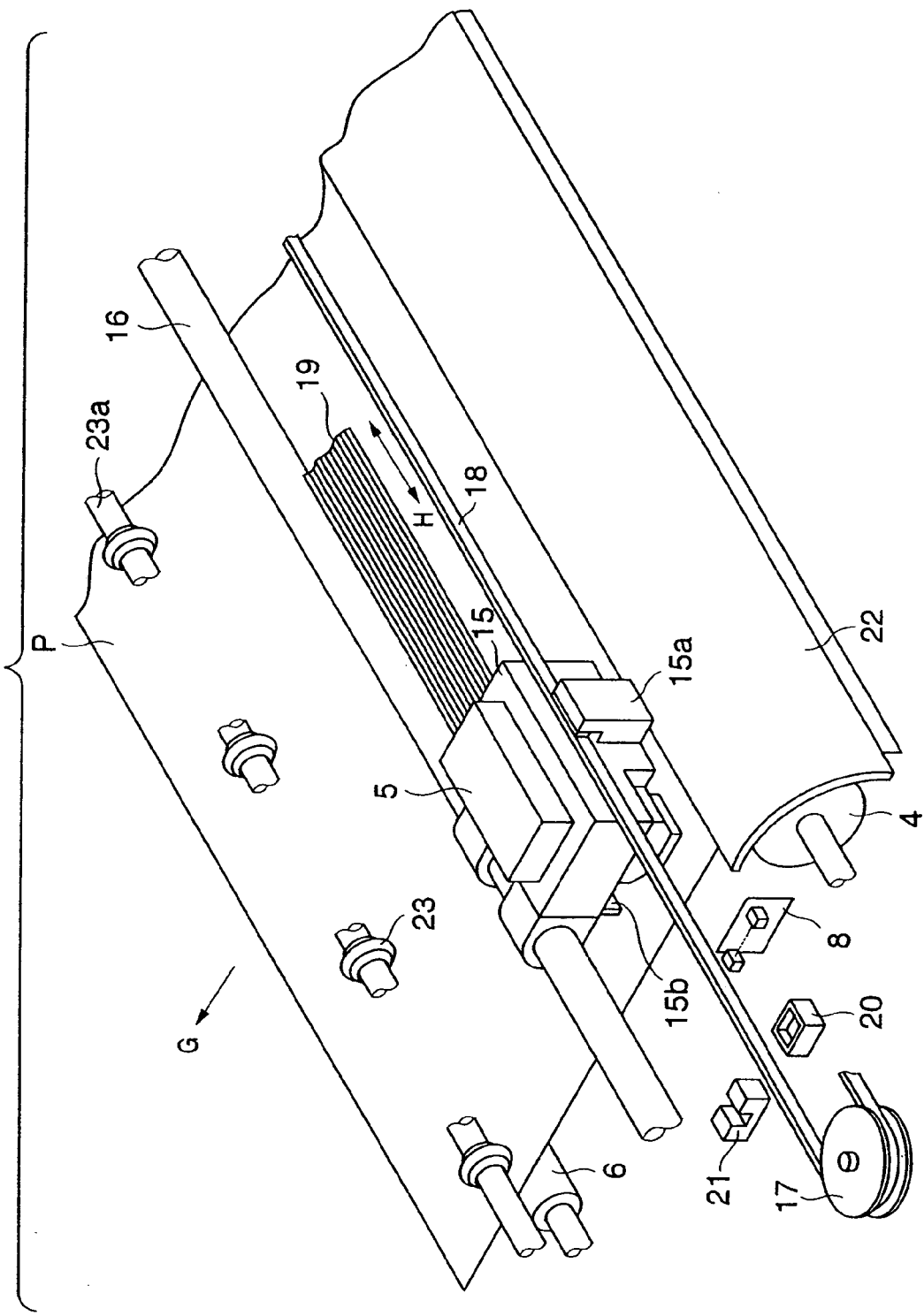
FIG. 1 is a perspective view of the overall construction of a printing apparatus using an inkjet printhead, according to one typical embodiment of the present invention.

FIG. 1 is a perspective view of the construction of a main body of a printing apparatus using an inkjet printhead, according to a typical embodiment of the present invention.

The printhead 5 shown in FIG. 1 has a built-in ink tank. However, it should be understood that the printhead of the present invention includes a so-called ink cartridge arrangement, in which the printhead and the ink tank can be separable from each other so that, when there is no more ink or if the printhead is damaged, either the printhead or the ink tank alone can be replaced as necessary. It is also possible to use a so-called integrated type instead of the separable type of ink cartridge, that is, a system in which the ink tank and the printhead form a single integrated unit, so that, when the ink is exhausted, the entire ink tank-printhead unit is replaced.

In FIG. 1, the carriage 15, while precisely supporting the printhead 5, is moved reciprocally back and forth in a main scanning direction indicated by arrow H in the diagram, that is, a direction orthogonal to the direction in which the printing paper P is conveyed, which is a sub-scanning direction, indicated by arrow G in the diagram. The carriage 15 is slidably supported by a guide rod 16 and a contactor 15a. The reciprocal movement of the carriage 15 is accomplished by a pulley 17 and a timing belt 18 driven by a carriage motor 30 (not shown). A flexible cable 19 is used to send printing signals and electric power to the printhead from the power circuit of the printing apparatus. The printhead 5 and the flexible cable 19 are connected by press-contact between their contact points.

In addition, a cap 20 that functions as an ink receiving means is provided at the home position of the carriage 15. The cap 20 moves up and down as necessary. When moving up, the cap 20 contacts the printhead 5 so as to cover the nozzles of the printhead 5 in order to prevent ink from evaporating and protect the printhead from dirt, dust and the like. A pump provided inside the cap 20 sucks ink away from the ink discharge nozzles to return the printhead 5 to a proper working ink discharge condition. Further, a cleaning blade (not shown) is provided near the cap 20 and moves with the printhead 5 in order to wipe ink away from the ink discharge surface of the printhead 5. The action of the above-described pump and cleaning blade causes ink to be suctioned away from the ink discharge nozzles of the printhead 5 and causes ink adhered onto the ink discharge surface of the printhead 5 to be removed, in order to reset the printhead 5 to proper working ink discharge condition. These operations are collectively called the "recovery operation".

Accordingly, in the above-described apparatus, in order to position the printhead 5 and the cap 20 opposite each other, a carriage home sensor 21 provided on the main body of the printing apparatus and a light shield 15b provided on the carriage 15 are used. A photo-interrupter is used for the carriage home sensor 21. When the carriage 15 moves to its waiting position, the passage of light emitted from a part of the carriage home sensor 21 is interrupted by the light shield 15b, thus indicating that the printhead 5 and the cap 20 are positioned opposite each other.

The printing paper P is fed from the direction of the bottom of the drawing toward the top, with the paper being curved horizontally by a feed roller 4 and a paper guide 22 and sent in the direction of arrow G (sub-scanning direction). The feed roller 4 and a discharge roller 6 are each driven by a conveyance motor 31 (not shown) and, as necessary, precisely convey the printing paper P in a sub-scanning direction in conjunction with the reciprocal movement of the carriage 15. Additionally, spurs 23 are arrayed in the sub-scanning direction and are made of a water-repellant material, of which a blade-like peripheral part alone contacts the printing paper P. These spurs 23, which are disposed opposite the discharge roller 6, are positioned at set intervals in the sub-scanning direction along a rod 23a so as to guide the discharge of the printed paper P without affecting any still-unfixed images printed on the paper.

Further, a droplet detection sensor 8 enables non-contact detection of ink droplets discharged from the printhead 5.

Figure 2:
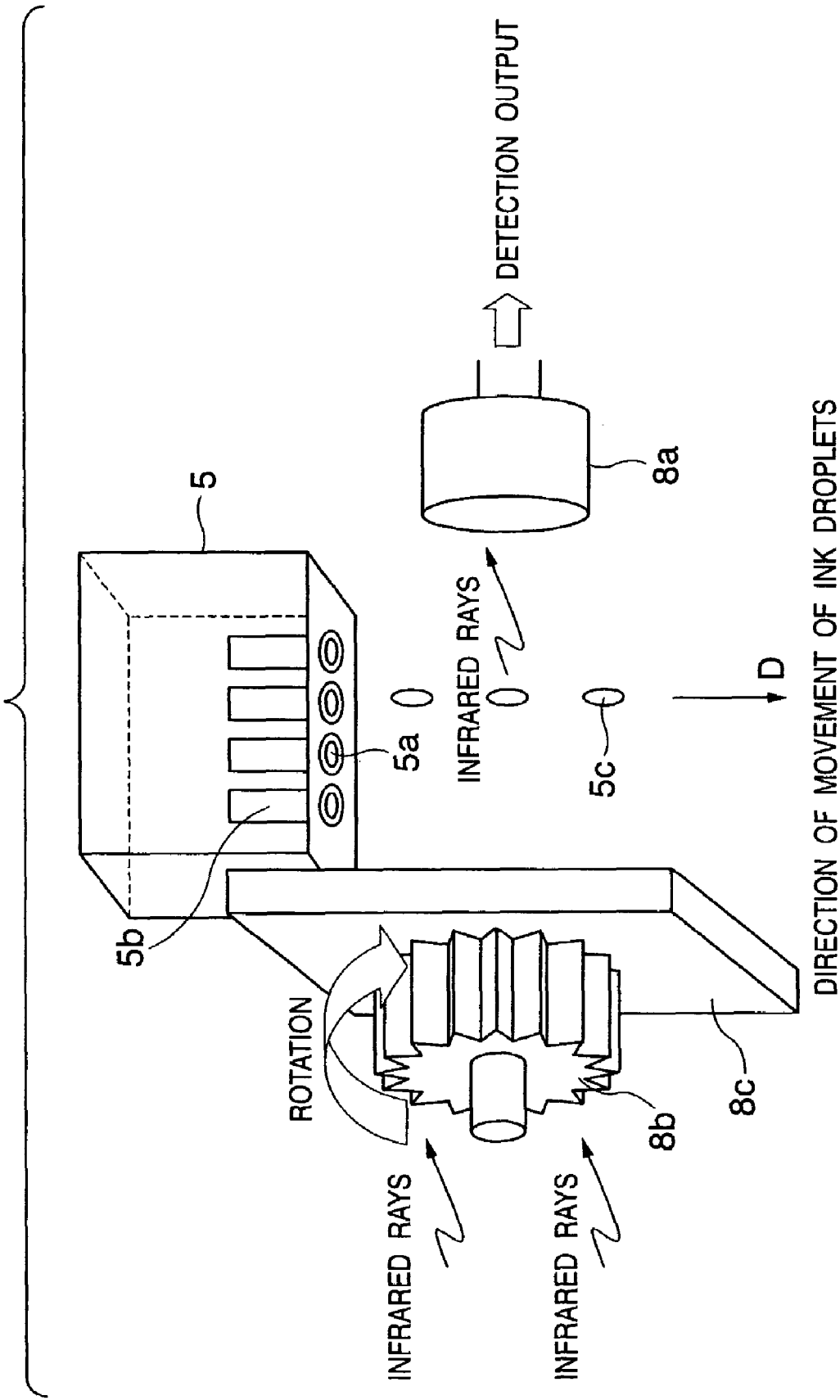
FIG. 2 is a diagram showing the structure of the liquid detection sensor and its positional relation to the printhead.

FIG. 2 is a diagram showing the structure of the liquid detection sensor 8 and its positional relation to the printhead.

The printhead 5 is filled with ink supplied from the ink tank. As shown in FIG. 2, the printhead 5 is provided with a plurality of nozzles 5a. Each of the nozzles 5a is equipped with a heater 5b that heats the ink to cause bubbles to form in the ink. As the bubbles grow, the pressure they exert discharges droplets of ink through the nozzles. The heaters 5b are driven by the application of drive pulses of a predetermined timing pattern, delivered via the circuitry of the printhead 5 from a printing apparatus controller to be described later.

The ink droplets 5c discharged from the nozzle 5a fly in the direction indicated by the arrow D in FIG. 2 and an infrared sensor 8a positioned near the flight path of the ink droplets 5c detects the presence (that is, the passage) of the ink droplets 5c and the amount of the ink droplets 5c without, however, physically contacting the ink droplets 5. The ink droplets 5c are heated by the heat from the heaters 5b at the time of discharge, so within the electromagnetic waves radiated from the ink droplets 5c at this time the radiation intensity in the infrared band is high. As a result, the present embodiment uses an infrared sensor as the electromagnetic waves detection unit for detecting the infrared radiation given off by the discharged ink droplets. Note that the heaters 5b can be used for not only discharging ink but also intentionally controlling ink temperature.

The output from the infrared sensor 8a changes according to the infrared rays emitted from the discharged ink droplets 5c, so by detecting these changes it is possible to determine the presence or absence of discharged ink droplets 5c and the volume of the ink droplets thus passing through the field of detection of the infrared sensor 8a.

That is, when ink is discharged the output from the infrared sensor 8a increases, and when no ink is discharged, the output from the infrared sensor 8a decreases. Also, as the ink discharge amount increases the amount of infrared radiation emitted also increases, as does the output from the infrared sensor 8a, and when the discharge duration is long, the state in which the output from the infrared sensor 8a is large continues for a longer time. In this embodiment, the output signal from the infrared sensor 8a is called a detection pulse. The output detection pulse is sent via a signal line to a controller to be described later.

Also, in the example shown in FIG. 2, a rotary gear 8b is provided at a position opposite the infrared sensor 8a, but within the detection field of the infrared sensor 8a. This rotary gear 8b is provided within the limited space inside the printing apparatus, so the rotary gear, which is one of the compositional elements of the printing apparatus is depicted as being disposed near the infrared sensor 8a. In such cases, a member 8c is provided at the front of the rotary gear 8b, so as to block infrared rays coming from the left of the rotary gear 8b toward the infrared sensor 8a.

If there is no such member 8c, then the infrared rays emitted from the left of the rotary gear 8b that are now not blocked are detected by the infrared sensor 8a, but since the emitted amount changes with the rotation of the rotary gear 8b they impart a certain instability to the infrared sensor 8a detection output. Vis-á-vis the detection output caused by the ink 5c, this instability constitutes noise that causes the S/N ratio to deteriorate. As a result, if there are only minor changes in the detection output of the infrared sensor 8a due to the ink, then the presence of ink cannot be detected at all during rotation of the rotary gear 8b. Providing this member 8c, however, dampens changes in the emitted infrared radiation amount due to the operation of the rotary gear 8b, eliminating noise from this source.

As can be appreciated by those of ordinary skill in the art, it is possible to provide a variety of different members other than the member 8c described above in order to prevent the incident infrared rays that constitute noise that degrades the sensitivity of the infrared sensor 8a.

Figure 3:
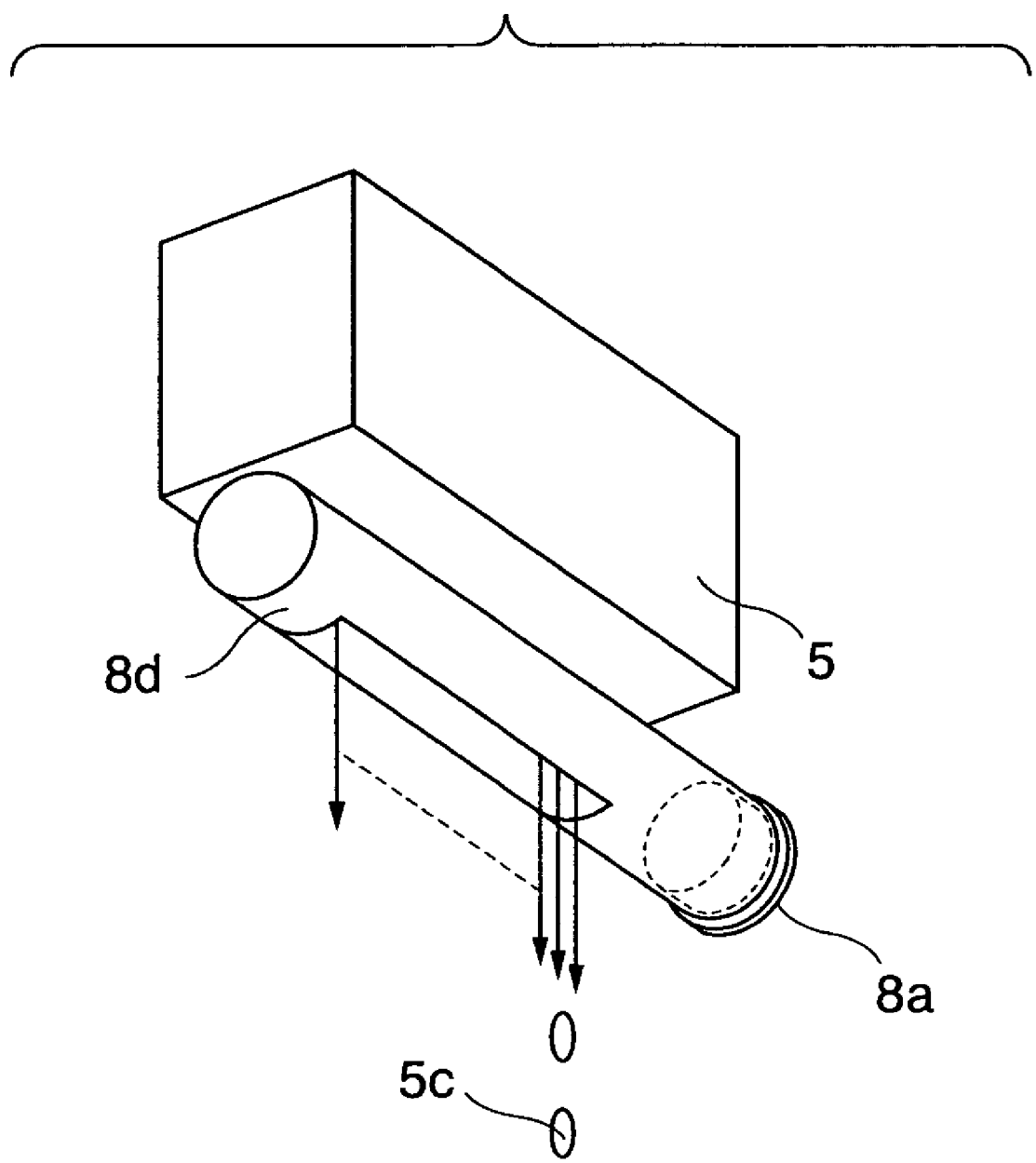
FIG. 3 is a diagram showing another member for blocking infrared rays.

FIG. 3 is a diagram showing a different member for blocking infrared rays according to another embodiment of the present invention.

The member 8d shown in FIG. 3 for blocking infrared rays is a cylinder having an opening at only that section of the cylinder that contacts the path along which the ink droplets 5a discharged from the printhead 5 fly, and is constructed in such a way as to cover the detection field of the infrared sensor 8a in order to block infrared rays entering from the outside. According to this embodiment of the present invention, such a construction stabilizes the air currents inside the detection field, making it possible to eliminate the occurrence of noise due to fluctuations in the air current.

Figure 4:
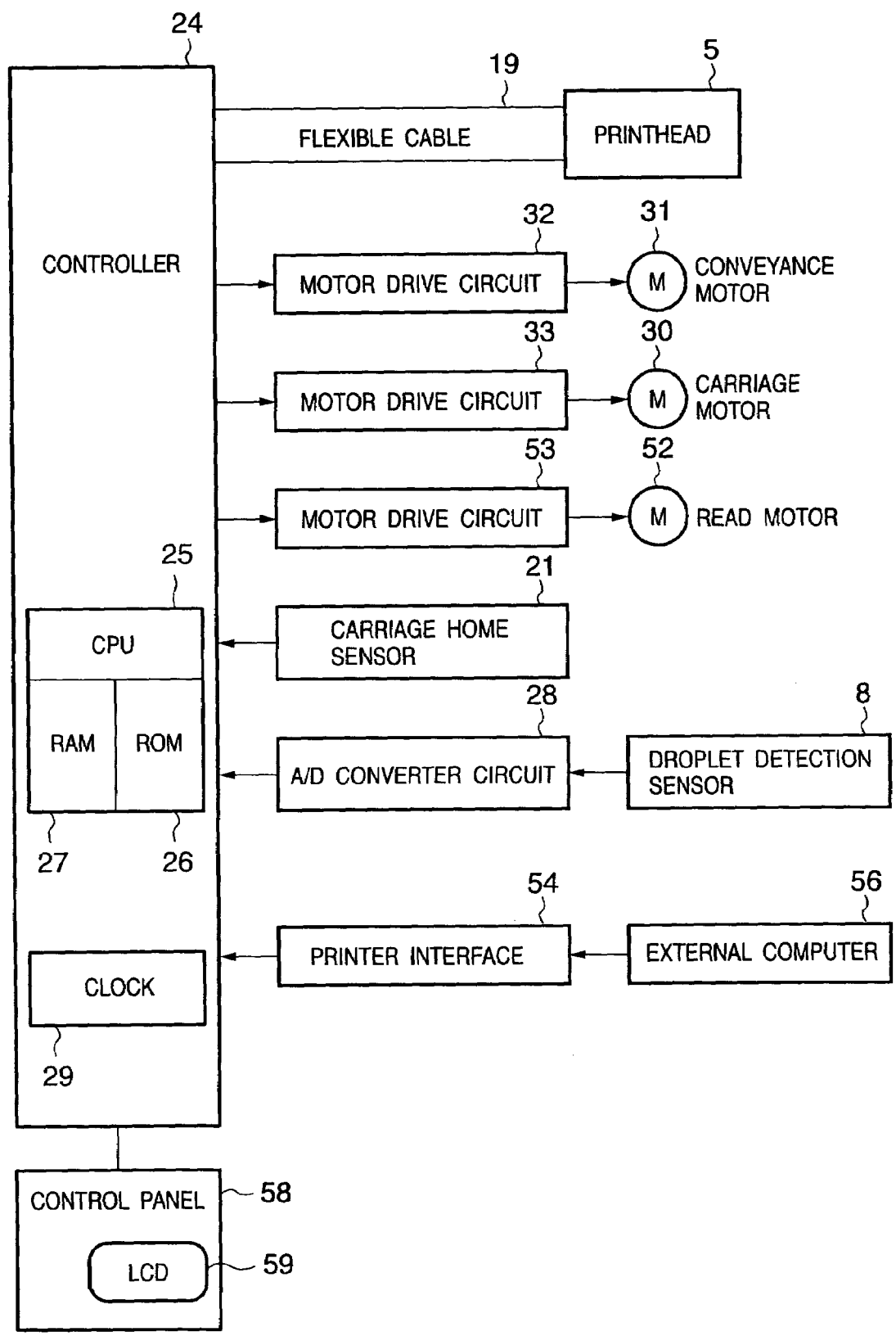
FIG. 4 is a block diagram of the control structure of the printing apparatus shown in FIG. 1.

FIG. 4 is a block diagram of the control structure of the printing apparatus shown in FIG. 1.

In FIG. 4, reference numeral 24 denotes a controller for controlling the overall apparatus. The controller 24 has a CPU 25, a ROM 26 for storing the control programs executed by the CPU 25 as well as a variety of data, a RAM 27 used as a work area by the CPU 25 as it executes various processes and for temporarily holding data (such as, for example, printing data), and a clock 29.

As shown in FIG. 4, the printhead 5 is connected to the controller 24 via a flexible cable 19. The flexible cable 19 contains control signal and image signal lines for conveying control signals and image signals from the controller 24 to the printhead 5. The output from the droplet detection sensor 8 is converted from analog into digital signals (a process hereinafter referred to as digitization) by an A/D converter circuit 28 in order to be in a form that can be analyzed by the CPU 25. The carriage motor 30 is a rotatable motor driven by the number of pulse steps from a motor drive circuit 32. The controller 24 controls the operation of the carriage motor 30 via a motor drive circuit 33, controls the operation of the conveyance motor 31 via the motor drive circuit 32, and controls the operation of a read motor 52 via a motor drive circuit 53, as well as inputs the output from the carriage home sensor 21.

In addition, the controller 24 is connected to a printer interface 54 that receives print commands and printing data from an external computer 56.

In addition, the controller is connected to a control panel 58 having various keys to enable an operator to input instructions and operate the apparatus. The control panel 58 is equipped with a liquid crystal display, or LCD 59, for the display of messages. Such messages may, for example, include error messages indicating the occurrence of an ink droplet discharge malfunction. Display of such error messages is voluntary, and accomplished by use of the above-described control panel keys.

The embodiments described above use an appropriately positioned shield member to prevent intrusion of infrared ray noise when using an infrared sensor to detect the presence of discharged ink droplets in an inkjet printing apparatus. As described above, the shielding member may be provided in the incident direction of such infrared ray noise, or it may be placed so as to cover the entire detection field of the infrared sensor. As a result, the present invention minimizes noise and provides improved discharged ink droplet detection.

(Other Embodiments)

Examples in which ink droplets discharged from a printhead are detected have been described in the foregoing embodiments. In this embodiment, an example in which a small amount of ink from an ink tank is detected will be described.

Figure 5:
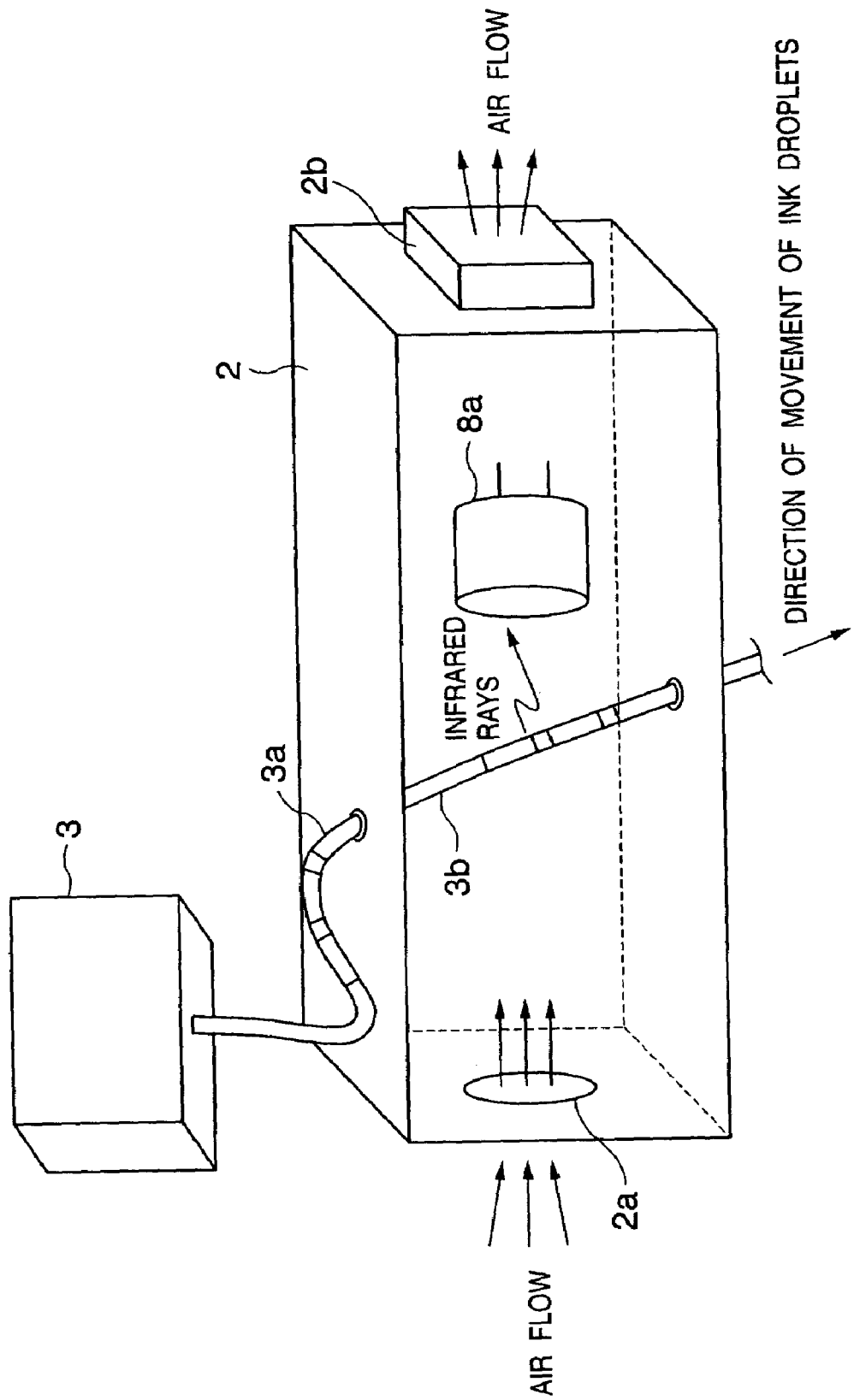
FIG. 5 shows detection of ink discharged from an ink tank.

FIG. 5 shows the structure of a detector for detecting a small amount of ink discharged from an ink tank. As shown in FIG. 5, ink 3a is moved from an ink tank 3 containing ink via a tube 3b to the printhead 5.

In the present embodiment, the infrared sensor 8a is positioned along the flow path of liquid such as ink, so as not to contact the tube 3b through which the ink or other liquid flows in order to detect the presence and volume of ink passing through the tube 3b without contacting the tube 3b. A housing member 2 is provided so as to cover the entire field of detection of the infrared sensor 8a in order to prevent the intrusion of infrared ray noise. It should be noted that an opening 2a for the intake of air is provided at at least one location on the housing member 2, with a fan 2b disposed opposite the air intake opening 2a so as to provide a constant air flow.

An arrangement such as that described above, because it forcibly creates a steady air current inside the housing 2, is very effective in suppressing fluctuation in the amount of infrared rays inside the field of detection of the infrared sensor 8a caused by the operation of a variety of components such as, for example, the power source, the motors, etc.

According to the above-described embodiment, by making use of the same principle as detecting ink droplets from a printhead, placing an infrared sensor located near the flow path of ink from an ink tank and providing a housing and a fan to suppress infrared ray noise, it is possible to detect the flow of ink from an ink tank via a tube to the printhead of the printing apparatus.

By so doing, for example, if the ink tank and the printhead are separately located and connected via a tube, it is possible to detect the presence of ink in the ink tank.

Note that, in the description of the above embodiments, a liquid droplet discharged from the printhead is ink, and the liquid stored in the ink tank is also ink. However, the liquid stored in the ink tank is not limited to ink. For example, the ink tank may store a processing liquid to be discharged onto a print medium so as to improve fixability and water repellency of a printed image or to improve its image quality.

Each of the embodiments described above has exemplified a printer, which comprises means (e.g., an electrothermal transducer, laser beam generator, and the like) for generating heat energy as energy utilized upon execution of ink discharge, and causes a change in state of an ink by the heat energy, among the inkjet printers. According to this inkjet printer and printing method, a high-density, high-precision printing operation can be attained.

As the typical arrangement and principle of the inkjet printing method, one practiced by use of the basic principle disclosed in, for example, U.S. Pat. Nos. 4,723,129 and 4,740,796 is preferable. The above system is applicable to either one of so-called on-demand and continuous types. Particularly, in the case of the on-demand type, the system is effective because, by applying at least one driving signal, which corresponds to printing information and gives a rapid temperature rise exceeding nucleate boiling, to each of electrothermal transducers arranged in correspondence with a sheet or liquid channels holding a liquid (ink), heat energy is generated by the electrothermal transducer to effect film boiling on the heat acting surface of the printhead, and consequently, a bubble can be formed in the liquid (ink) in one-to-one correspondence with the driving signal. By discharging the liquid (ink) through a discharge opening by growth and shrinkage of the bubble, at least one droplet is formed. If the driving signal is applied as a pulse signal, the growth and shrinkage of the bubble can be attained instantly and adequately to achieve discharge of the liquid (ink) with particularly high response characteristics.

As the pulse driving signal, signals disclosed in U.S. Pat. Nos. 4,463,359 and 4,345,262 are suitable. Note that further excellent printing can be performed by using the conditions described in U.S. Pat. No. 4,313,124 of the invention which relates to the temperature rise rate of the heat acting surface.

As an arrangement of the printhead, in addition to the arrangement as a combination of discharge nozzles, liquid channels, and electrothermal transducers (linear liquid channels or right angle liquid channels) as disclosed in the above specifications, the arrangement using U.S. Pat. Nos. 4,558,333 and 4,459,600, which disclose the arrangement having a heat acting portion arranged in a flexed region is also included in the present invention. In addition, the present invention can be effectively applied to an arrangement based on Japanese Patent Publication Laid-Open No. 59-123670 which discloses the arrangement using a slot common to a plurality of electrothermal transducers as a discharge portion of the electrothermal transducers, or Japanese Patent Publication Laid-Open No. 59-138461 which discloses the arrangement having an opening for absorbing a pressure wave of heat energy in correspondence with a discharge portion.

In addition, not only a cartridge type printhead in which an ink tank is integrally arranged on the printhead itself, but also an exchangeable chip type printhead, as described in the above embodiments, which can be electrically connected to the apparatus main unit and can receive ink from the apparatus main unit upon being mounted on the apparatus main unit, can be applicable to the present invention.

It is preferable to add recovery means for the printhead, preliminary auxiliary means, and the like to an arrangement of the printer of the present invention since the printing operation can be further stabilized. Examples of such means include, for the printhead, capping means, cleaning means, pressurization or suction means, and preliminary heating means using electrothermal transducers, another heating element, or a combination thereof. It is also effective for stable printing to provide a preliminary discharge mode which performs discharge independently of printing.

Furthermore, as a printing mode of the printer, not only a printing mode using only a primary color such as black or the like, but also at least one of a multi-color mode using a plurality of different colors or a full-color mode achieved by color mixing can be implemented in the printer either by using an integrated printhead or by combining a plurality of printheads.

Moreover, in each of the above-mentioned embodiments of the present invention, it is assumed that the ink is a liquid. Alternatively, the present invention may employ an ink which is solid at room temperature or less and softens or liquefies at room temperature, or an ink which liquefies upon application of a use printing signal, since it is a general practice to perform temperature control of the ink itself within a range from 30° C. to 70° C. in the inkjet system, so that the ink viscosity can fall within a stable discharge range.

In addition, in order to prevent a temperature rise caused by heat energy by positively utilizing it as energy for causing a change in state of the ink from a solid state to a liquid state, or to prevent evaporation of the ink, an ink which is solid in a non-use state and liquefies upon heating may be used. In any case, an ink which liquefies upon application of heat energy according to a printing signal and is discharged in a liquid state, an ink which begins to solidify when it reaches a printing medium, or the like, is applicable to the present invention.

In this case, ink may be situated opposite electrothermal transducers while being held in a liquid or solid state in recess portions of a porous sheet or through-holes, as described in Japanese Patent Publication Laid-Open No. 54-56847 or 60-71260. In the present invention, the above-mentioned film boiling method is most effective for the above-mentioned inks.

In addition, the inkjet printer of the present invention may be used in the form of a copying machine combined with a reader, and the like, or a facsimile apparatus having a transmission/reception function in addition to an image output terminal of an information processing equipment such as a computer.

The present invention can be applied to a system constituted by a plurality of devices (e.g. a host computer, an interface device, a reader, and a printer), or to an apparatus comprising a single device (e.g. a copying machine or a facsimile apparatus).

As many apparently widely different embodiments of the present invention can be made without departing from the spirit and scope thereof, it is to be understood that the invention is not limited to the specific embodiments thereof except as defined in the appended claims.

What is claimed is:

1. A liquid detection method comprising:
   a detection step of detecting electromagnetic waves radiated from an area of a discharge path of liquid discharged from a liquid supply source by using a detection unit provided near the discharge path;
   a minimize step of minimizing electromagnetic waves radiated from a medium other than the liquid or variation in the electromagnetic waves during detection of the electromagnetic waves in said detection step; and
   a determination step of determining whether or not the liquid is present and, if present, determining the amount of the discharged liquid based on the electromagnetic waves detected in said detection step,
   wherein the electromagnetic waves are infrared rays and said detection step effects detection with an infrared sensor,
   wherein said minimize step is effected by using a housing that covers the infrared sensor and an infrared ray detection field of the infrared sensor, and
   wherein a steady air flow is generated inside the housing by providing an air intake opening on the housing, and a fan at a position opposite the air intake opening on the housing.

2. A liquid detection apparatus comprising:
   detection means, provided near a discharge path of liquid discharged from a liquid supply source, for detecting electromagnetic waves radiated from an area of the discharge path;
   suppression means for minimizing electromagnetic waves radiated from a medium other than the liquid or variation in the electromagnetic waves during detection of the electromagnetic waves by said detection means; and
   determination means for determining whether or not the liquid is present and, if present, determining the amount of the discharged liquid based on the electromagnetic waves detected by said detection means,
   wherein the electromagnetic waves are infrared rays and said detection means comprises an infrared sensor,
   wherein said suppression means comprises a housing that covers the infrared sensor and an infrared ray detection field of infrared sensor, and
   wherein an air intake opening is provided on the housing, and a fan is provided at a position opposite the air intake opening on the housing so as to generate a steady air flow inside the housing.

3. The apparatus according to claim 2, wherein said suppression means comprises a shield provided in front of a source of infrared rays radiated from a medium other than the liquid.

4. The apparatus according to claim 2, wherein the housing is provided with an opening for passage of the discharged liquid.

5. The apparatus according to claim 2, wherein the liquid includes ink.

6. The apparatus according to claim 5, wherein the liquid supply source comprises an inkjet printhead, and the infrared sensor is located in front of ink discharge nozzles of the inkjet printhead, near the discharge path of ink droplets discharged from the inkjet printhead.

7. The apparatus according to claim 5, wherein the liquid supply source comprises an ink tank, and the infrared sensor is located near a tube connected to an outflow outlet provided in the ink tank.

8. A printing apparatus using a liquid detection apparatus according to any one of claims 2, 3, 4 and 5-7, comprising:
   an inkjet printhead having an electrothermal transducer which generates heat energy to be applied to ink in order to discharge the ink by using the heat energy; and
   adjustment means for adjusting the temperature of the ink for detection of ink droplets by the liquid detection apparatus by applying electric current to the electrothermal transducer.

* * * * *